(12) United States Patent
Hurwitz et al.

(10) Patent No.: US 9,349,788 B2
(45) Date of Patent: May 24, 2016

(54) THIN FILM CAPACITORS EMBEDDED IN POLYMER DIELECTRIC

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 89 days.

(21) Appl. No.: 13/962,075

(22) Filed: Aug. 8, 2013

(65) Prior Publication Data

US 2015/0043126 A1    Feb. 12, 2015

(51) Int. Cl.
  *H01G 4/005* (2006.01)
  *H01L 49/02* (2006.01)
  *H01G 4/33* (2006.01)
  *H01G 4/224* (2006.01)
  *H01G 4/228* (2006.01)

(52) U.S. Cl.
  CPC ............... *H01L 28/65* (2013.01); *H01G 4/224* (2013.01); *H01G 4/228* (2013.01); *H01G 4/33* (2013.01)

(58) Field of Classification Search
  USPC .......... 361/303, 305, 306.1–306.3, 311–313, 361/321.2, 321.1
  See application file for complete search history.

(56) References Cited

U.S. PATENT DOCUMENTS

2003/0219956 A1* 11/2003 Mori et al. ............... 438/393
2008/0145622 A1*  6/2008 Roy et al. ................. 428/195.1

* cited by examiner

*Primary Examiner* — Nguyen T Ha
(74) *Attorney, Agent, or Firm* — Wiggins and Dana LLP; Gregory S. Rosenblatt; Jonathan D. Hall

(57) ABSTRACT

A substrate comprising a capacitor comprising metal electrodes and a ceramic or metal oxide dielectric layer, the capacitor being embedded in a polymer based encapsulating material and connectable to a circuit via a via post standing on said capacitor.

27 Claims, 18 Drawing Sheets

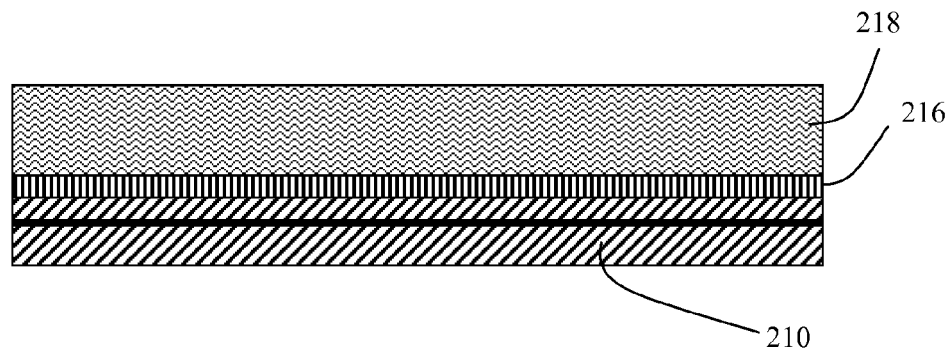
Fig. 5(vi)
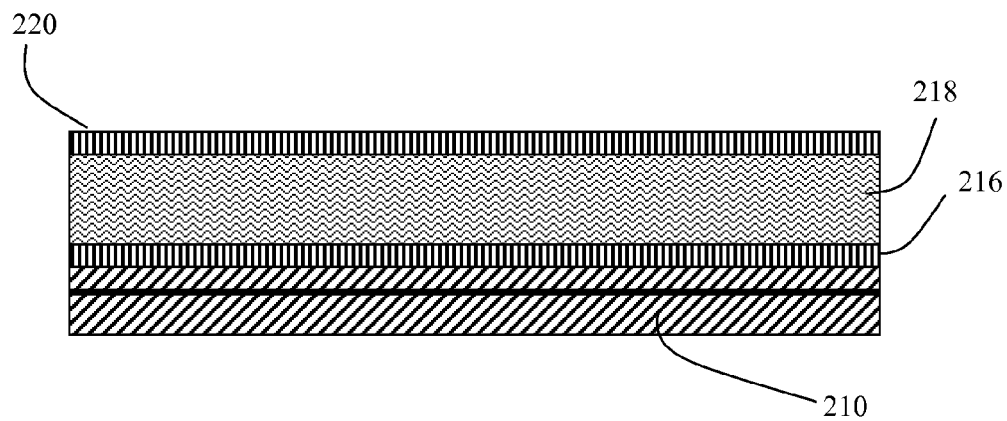
Fig. 5(vii)
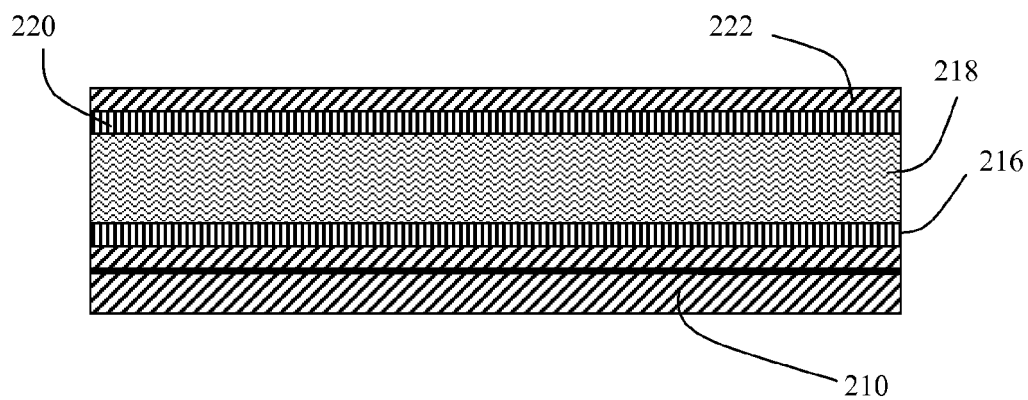
Fig. 5(viii)

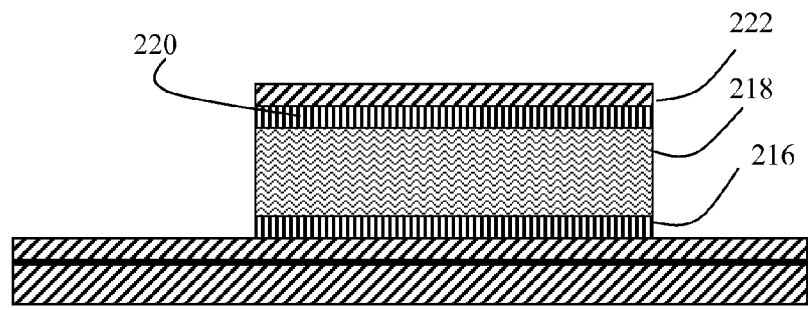
Fig. 5(xii)
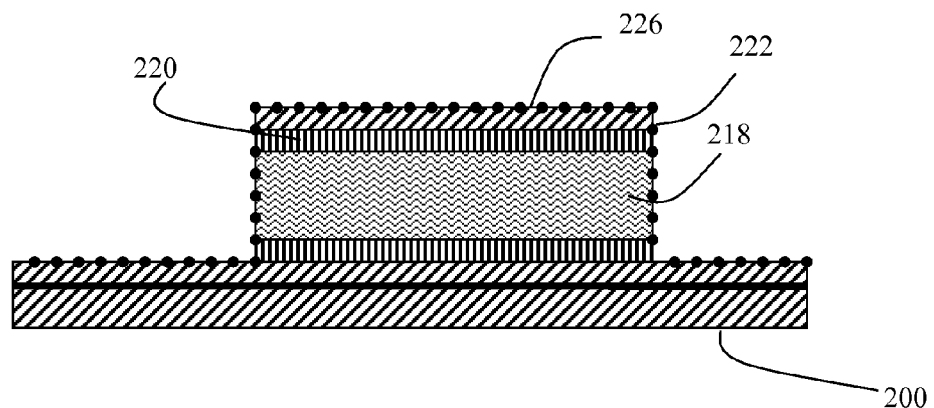
Fig. 5(xiii)
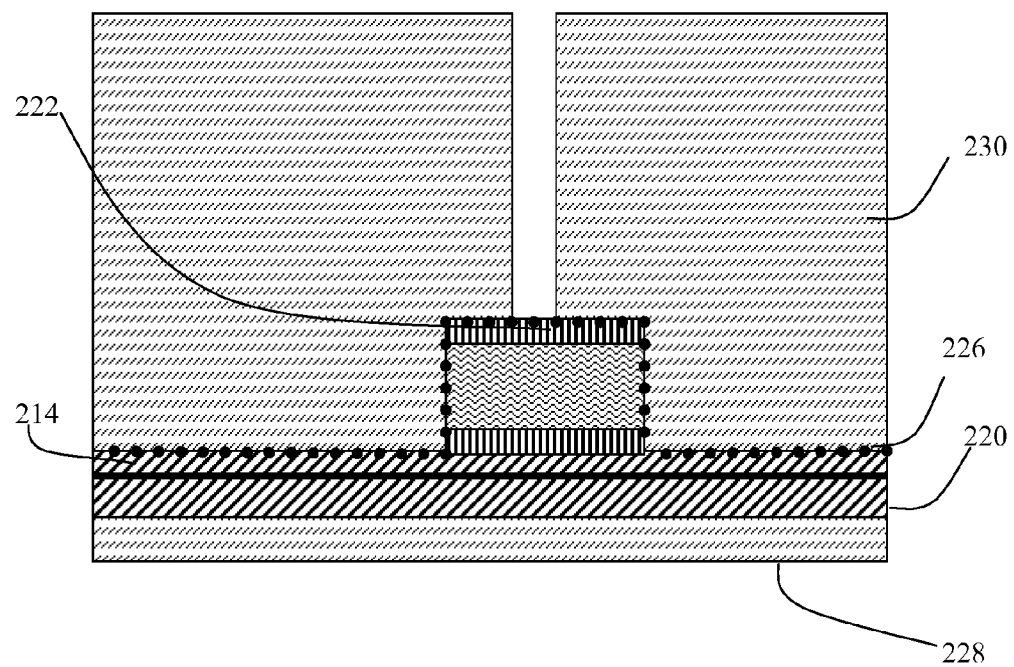
Fig. 5(xiv)

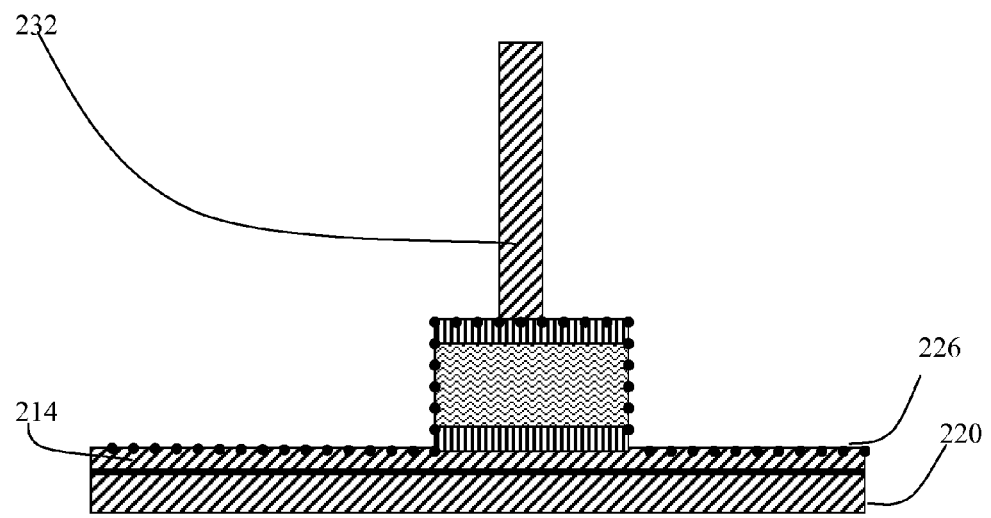
Fig. 5(xvi)

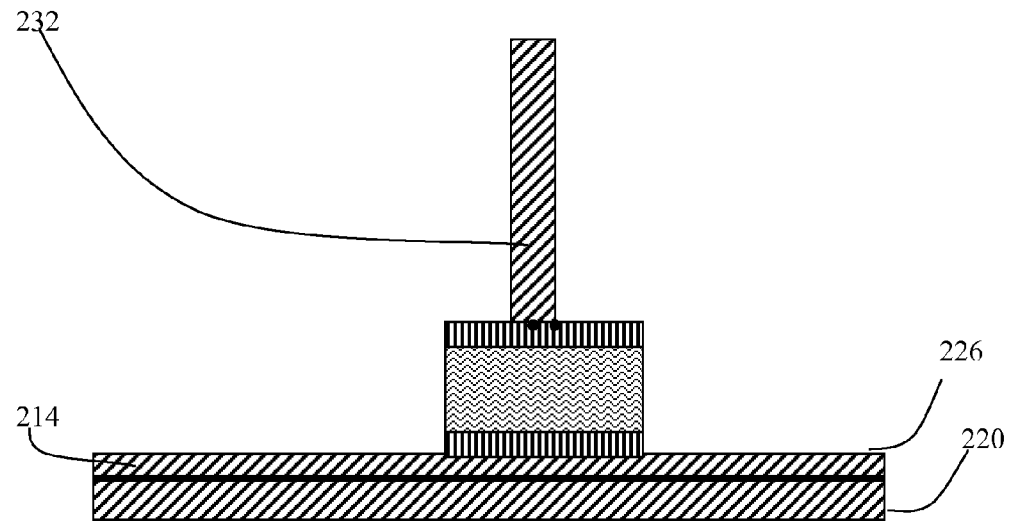
Fig. 5(xvii)
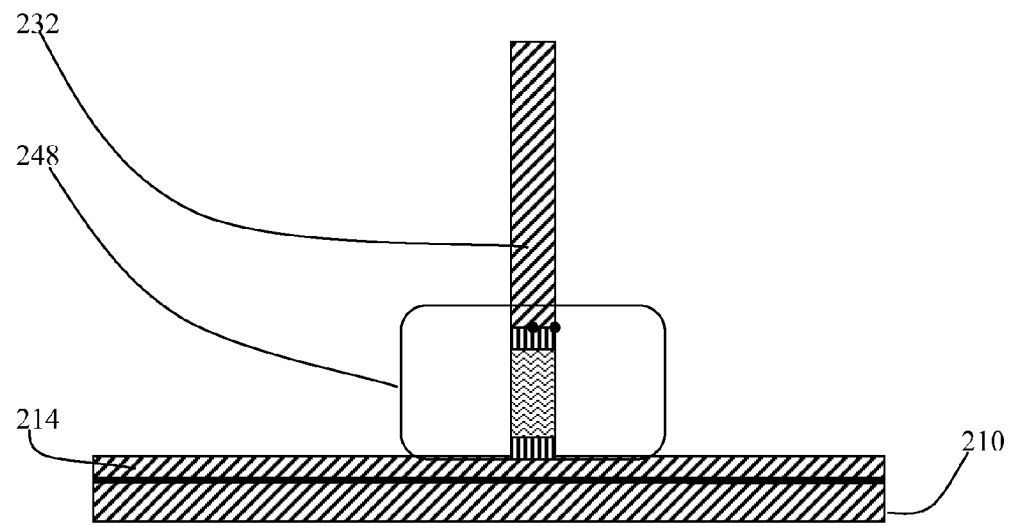
Fig. 5(xviii)

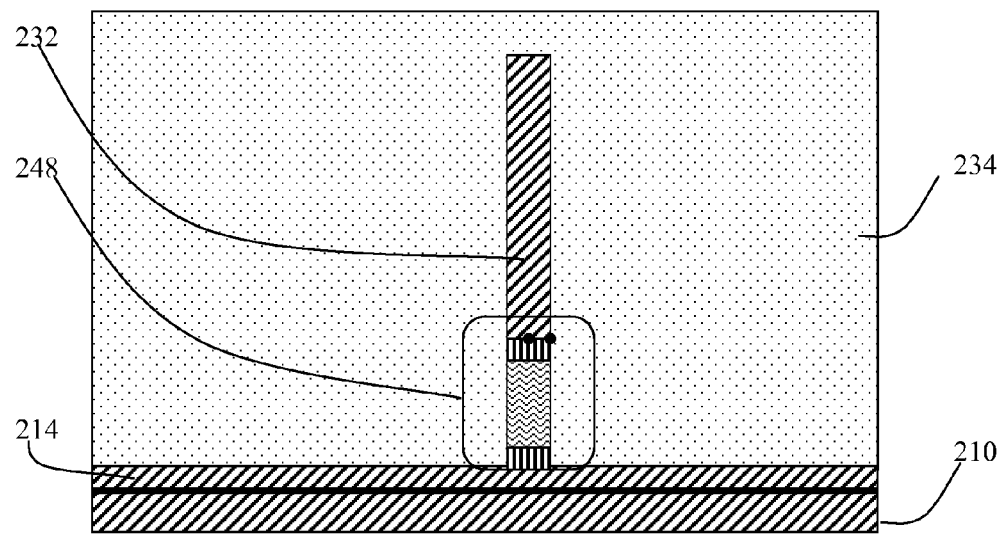
Fig. 5(xix)

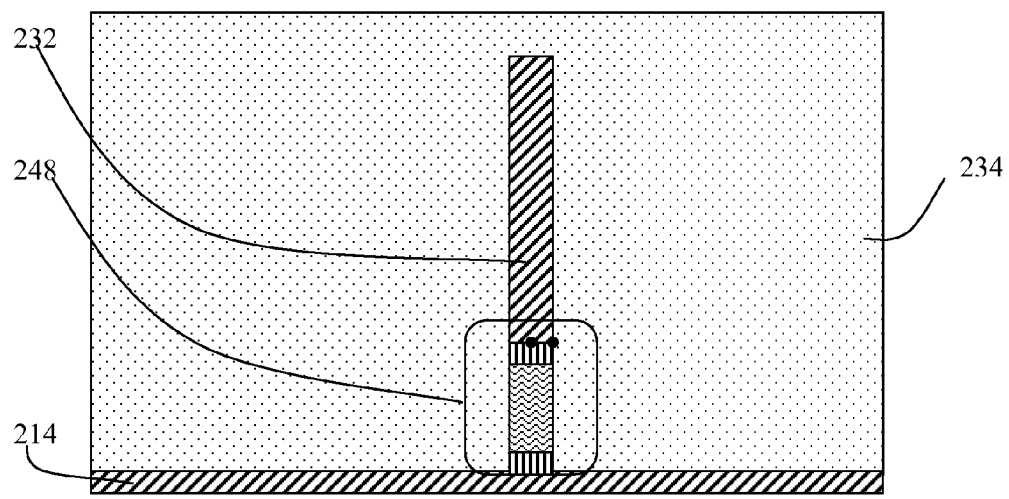
Fig. 5(xxi)
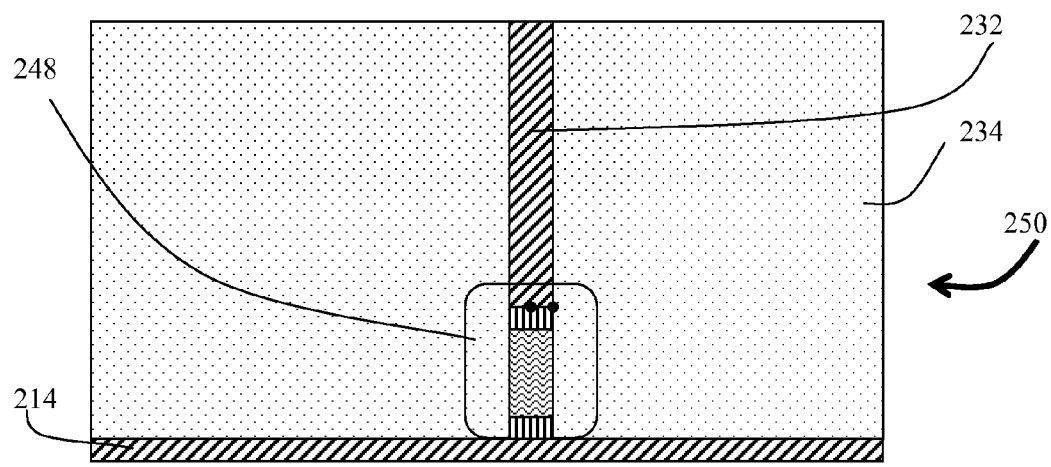
Fig. 5(xxii)

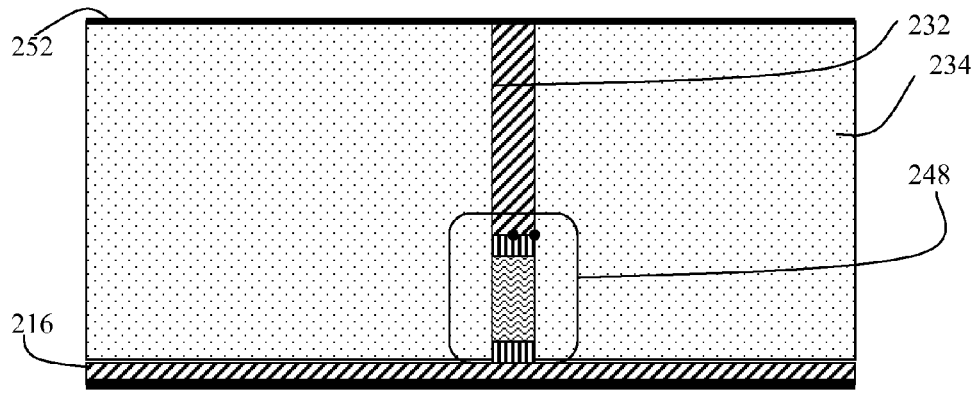
Fig. 6(xxiii)
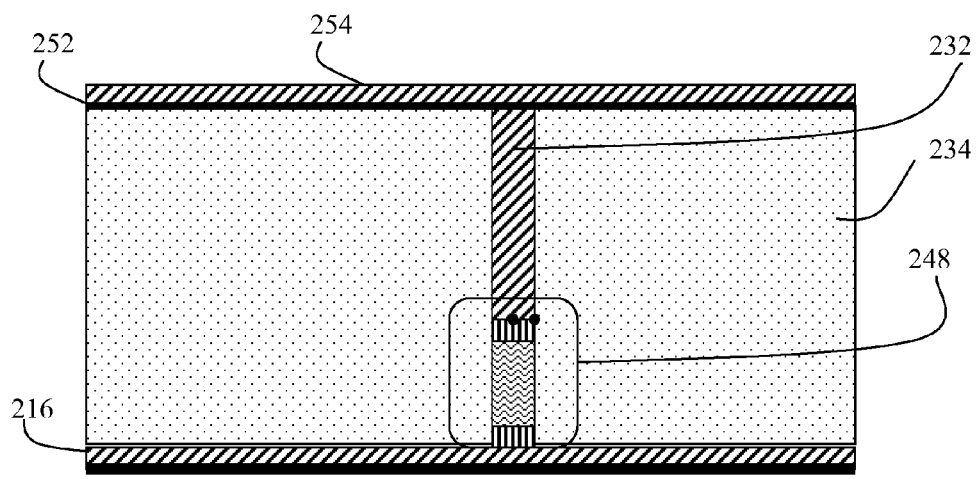
Fig. 6(xxiv)
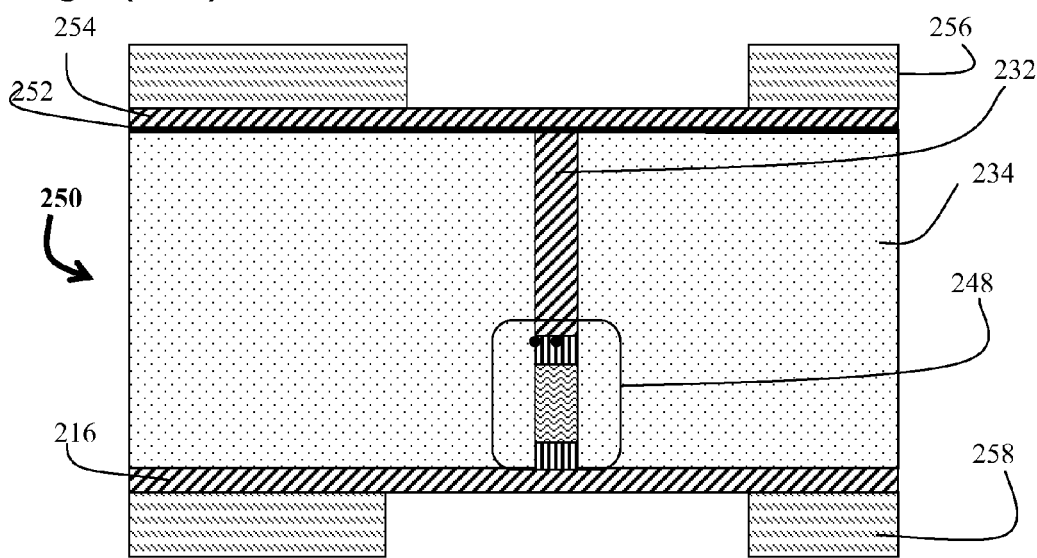
Fig. 6(xxv)

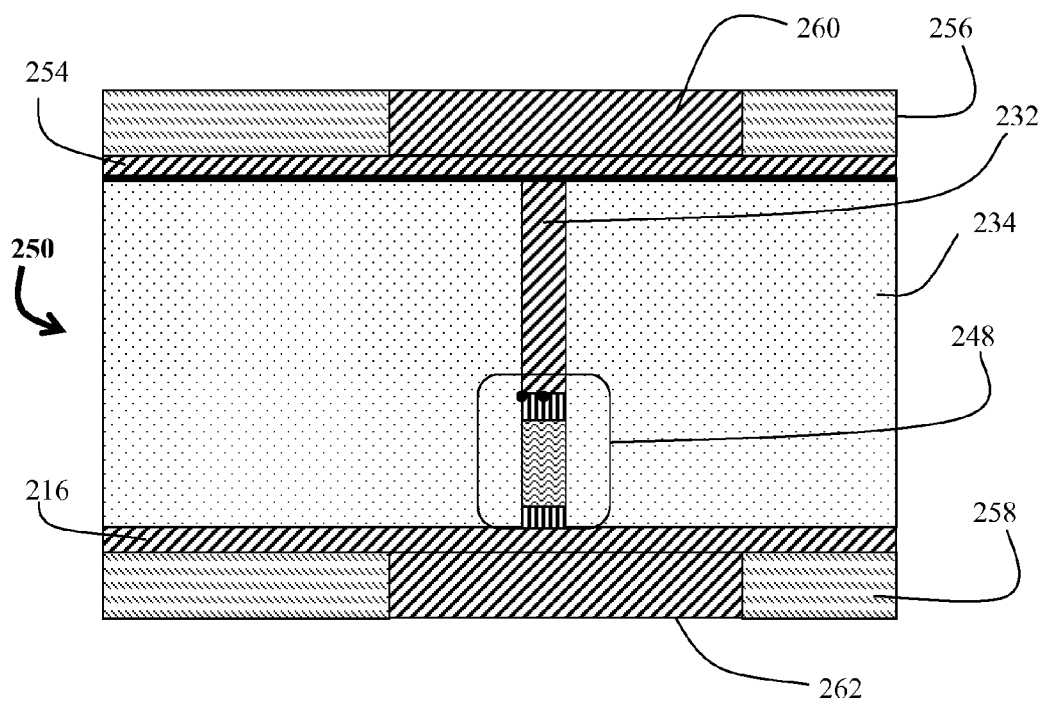
Fig. 6(xxvi)
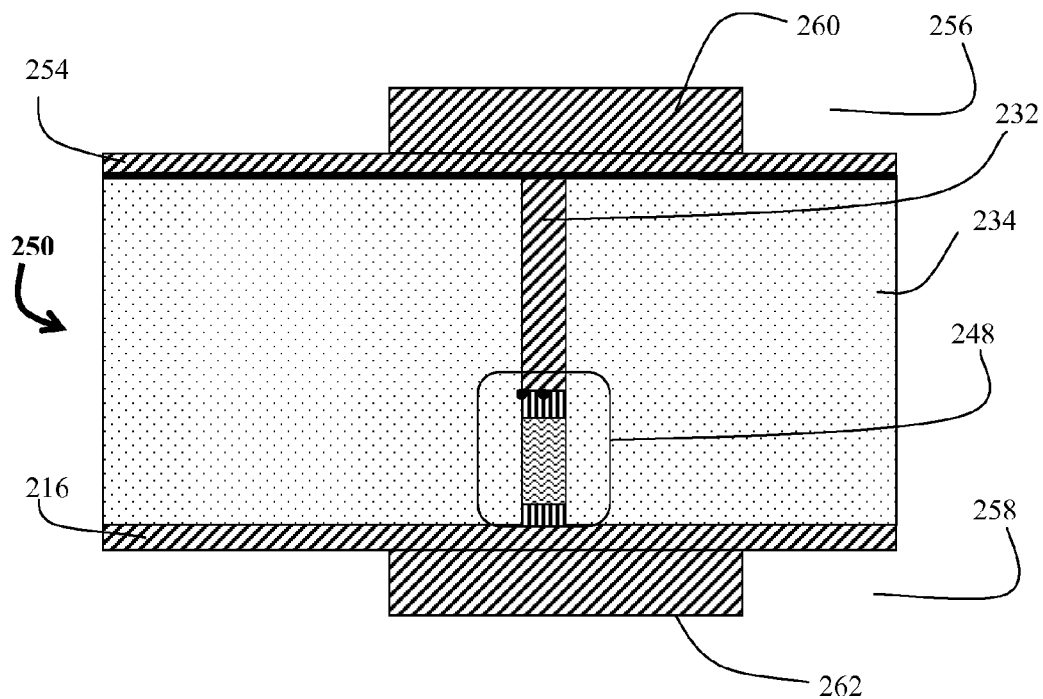
Fig. 6(xxvii)

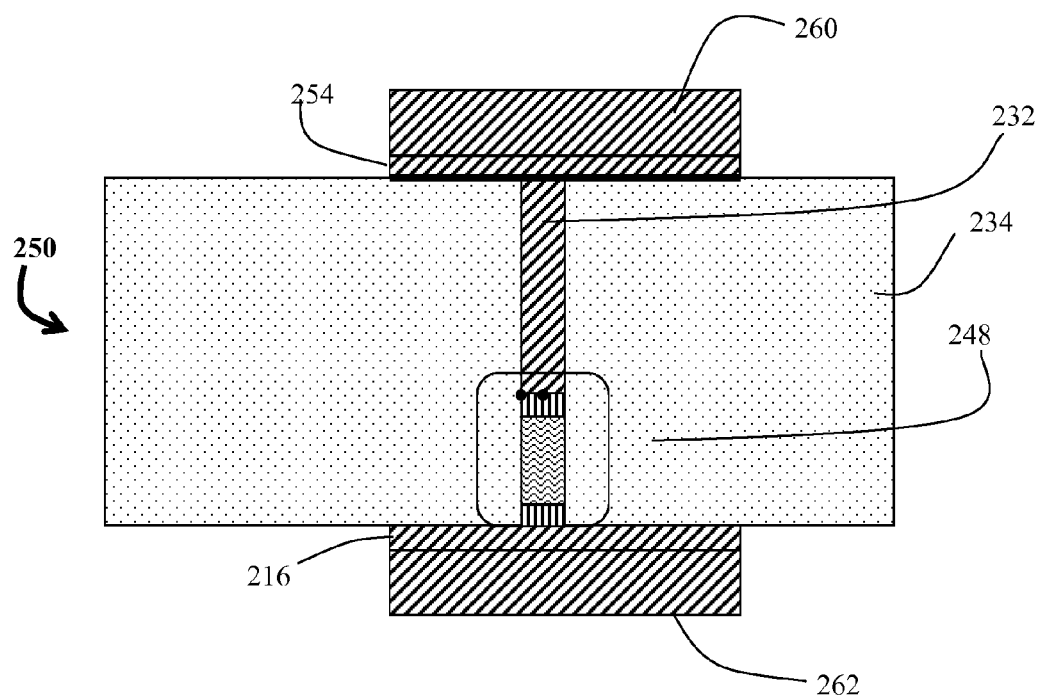
Fig. 6(xxviii)
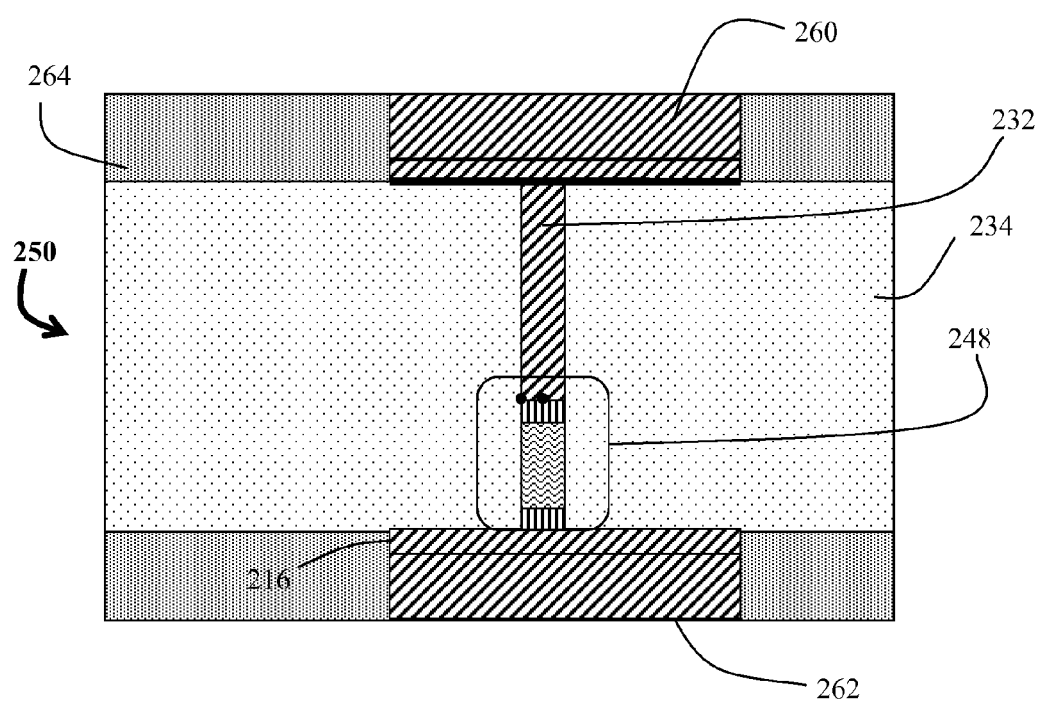
Fig. 6(xxix)

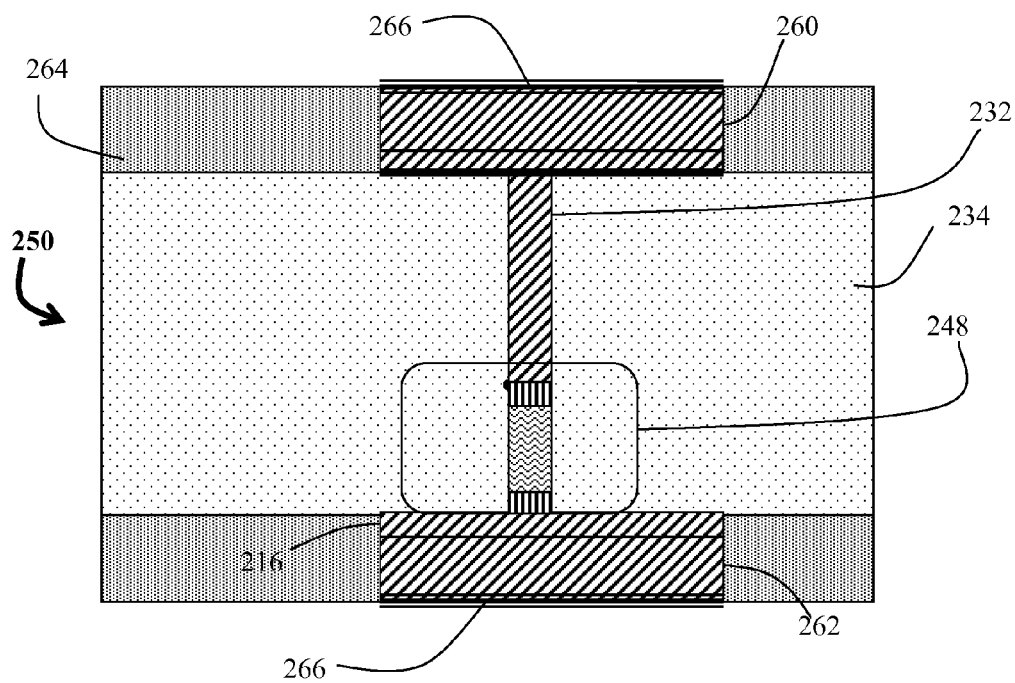
Fig. 6(xxx)

THIN FILM CAPACITORS EMBEDDED IN POLYMER DIELECTRIC

BACKGROUND

1. Field of the Disclosure

The present invention is directed to thin film capacitors, and to multilayer interconnect structures with embedded thin film capacitors.

2. Description of the Related Art

An established method of fabricating electronic substrates and interconnects is by electroplating metal layers and metal interconnects and embedding these in a polymer based dielectric. One fabrication technique uses drill & fill to provide conductive vias.

An alternative solution that overcomes many of the inherent disadvantages of the drill & fill approach, is to fabricate vias by depositing copper or other metal into a pattern created in a photo-resist, using a technology otherwise known as 'pattern plating'.

In pattern plating, a seed layer is first deposited over a substrate, providing a conducting layer onto which copper may be deposited. Then a layer of photo-resist is deposited thereover and subsequently exposed to create a pattern, and selectively removed to make trenches that expose the seed layer. Via posts are created by depositing copper into the photo-resist trenches. The remaining photo-resist is then removed, the seed layer is etched away, and a dielectric material, that is typically a polymer impregnated glass fiber mat, is laminated thereover and therearound to encase the vias posts. Various techniques and processes can then be used to planarize the dielectric material, removing part of it to expose the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick cored interconnects prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer. Typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

RF (Radio Frequency) technologies, such as Bluetooth, Wi-Fi and the like, are becoming widely implemented in various devices, including mobile phones and automobiles.

In addition to processing and memory chips, RF devices in particular, require passive components such as capacitors and filters of various sorts. Such passive components may be surface mounted, but to enable ever greater miniaturization and cost savings, such devices may be embedded within the substrates.

One advantage of the plating process for via fabrication is that shaped vias may be deposited instead of simple cylindrical posts. This provides some flexibility in the fabrication of capacitors, which can be embedded in the substrates themselves, or separately fabricated and then surface mounted onto a substrate.

Embedding passive devices within substrates is not without its downside. The more complicated the substrate, the higher the likelihood of some aspect failing, and so embedding components can adversely affect yields. The more complicated and integrated a component, the more difficult it is to isolate a root cause of some failure thereof and to attend to the underlying causes.

Aspects of the present invention are directed to substrates with embedded passive components and methods of fabrication thereof.

BRIEF SUMMARY

A first aspect of the invention is directed to providing a capacitor comprising metal electrodes and a dielectric layer comprising ceramic and/or metal oxide, the capacitor being embedded in a polymer based encapsulating material and connectable to a circuit via a contact to the lower electrode and a via post deposited over the capacitor.

Optionally, at least one electrode comprises a noble metal.

In some embodiments, the noble metal selected from the group comprising tantalum, gold and platinum.

In some embodiments, the ceramic dielectric layer is selected from the group consisting of $Ta_2O_5$, $BaO_4SrTi$, and $TiO_2$.

Optionally, the ceramic dielectric layer further comprises a layer of aluminium oxide found between the metal electrodes and the ceramic dielectric layer, such that flaws in the dielectric layer are sealed with aluminium oxide.

In some embodiments, the polymer based encapsulating material is selected from the group consisting of polyimide, epoxy, BT (Bismaleimide/Triazine) and their blends.

Optionally, the polymer based encapsulating material further comprises glass fibers.

Optionally, the polymer matrix further comprises inorganic particulate fillers having mean particle size of between 0.5 microns and 30 microns and between 15% and 30% of particulate by weight.

The capacitor may be embedded in a substrate comprising feature layers coupled by via posts laminated with an encapsulating dielectric material.

The capacitor may be terminated by copper pads separated by solder mask, the copper pads being protected with ENEPIG to prevent tarnish.

Alternatively, the capacitor of claim 1, being terminated by copper pads separated by solder mask, the copper pads being protected with an organic varnish to prevent tarnish.

A second embodiment, is directed to providing a method of fabricating a capacitor comprising the steps of:
(i) Procuring a carrier;
(ii) Depositing a barrier layer;
(iii) Planarizing the barrier layer;
(iv) Depositing a thin layer of copper over the barrier layer;
(v) Depositing a first electrode;
(vi) Depositing a dielectric layer;
(vii) Sputtering a copper seed layer
(ix) Depositing photoresist over the seed layer, and patterning the layer of photoresist over the seed layer to create a layer of vias;
(x) Electroplating copper via into the pattern of the photoresist
(xi) Stripping away the photoresist;
(xii) Etching away the seed layer;
(xiv) Laminating dielectric material over the thin film capacitor;
(xv) Thinning and planarizing the dielectric material.

Optionally, the method further comprises an additional step selected from the group consisting of (vb) and (vib) of depositing a layer of aluminium adjacent to the layer of dielectric, and oxidizing to aluminium oxide, thereby sealing defects in the layer of dielectric.

In some embodiments, after step (vi) of deposition of the dielectric layer and prior to step (viii) deposition of the copper seed layer, in step (vii) an upper electrode of noble metal is deposited.

In some embodiments, subsequent to step (xii) of etching away the seed layer and prior to step (xiv) of lamination, there is an additional step (xiii) of plasma etching the electrodes and the dielectric of the capacitor around the copper via, and reducing the size of the capacitor to the footprint of the copper via thereover.

Typically, the method further comprises the steps of:
(xvi) Depositing a further layer of copper over the second electrode;
(xvii) Applying photoresist to both sides of the copper carrier and patterning the upper layer to create an array of capacitors;
(xviii) Etching away exposed areas of the upper layer of copper;
(xix) Removing exposed area of upper electrode, dielectric and lower electrode material;
(xx) Stripping away the photoresist;

Optionally, the electrodes are fabricated from a noble metal.

Optionally, the noble metal is selected from the group consisting of gold, platinum and tantalum.

Typically, the dielectric layer is fabricated from a ceramic.

Optionally, the ceramic is selected from the group consisting of $Ta_2O_5$, $BaO_4SrTi$, and $TiO_2$.

Optionally, the method for fabricating surface mountable capacitors further comprising the steps of:
(xxi) Removing the copper carrier;
(xxii) Removing the barrier layer;
(xxiii) Depositing a seed layer titanium
(xxiv) Depositing a seed layer of copper
(xxv) Laying down and patterning layers of photoresist on each side of the substrate with embedded capacitor;
(xxvi) Electroplating copper contact ports into the patterned photoresist layers;
(xxvii) Stripping away the patterned photoresist;
(xxviii) Etching away the nickel and copper seed layers leaving discrete copper contact ports;
(xxix) Laying down solder mask around the discrete copper contact ports, and
(xxx) Terminating.

Where fabricated as an array, the capacitors may now be singulated by step (xxxi) Singulating.

Optionally, said terminating comprises coating the copper contact ports with a tarnish proof conducting layer by ENEPIG.

Alternatively, said terminating comprises coating the copper contact ports with an organic varnish.

In some embodiments, the method further comprises the steps of depositing at least one feature or via layer prior to step (iv).

In some embodiments, the method further comprises the steps of depositing at least one feature or via layer subsequent to step (xx).

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIGS. 5(*i*), 5(*ii*), and 5(*iv*) to 5(*xxii*) are a series of annotated schematic illustrations showing how the capacitors of FIG. 5 are built up, stage by stage;

FIG. 6(*xxiii*) to FIG. 6(*xxx*) are a series of schematic cross section illustrations illustrating a process for termination a substrate with an embedded capacitor;

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

Since capacitors comprise a dielectric material sandwiched between electrodes, typically a material with a very high dielectric constant, the dielectric material used for encapsulation is referred to hereinbelow as an 'encapsulation dielectric' or 'encapsulating dielectric' to differentiate it from the dielectric of the capacitor.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that there is no effective upper limit to the in-plane dimensions of a feature.

Figure 1:
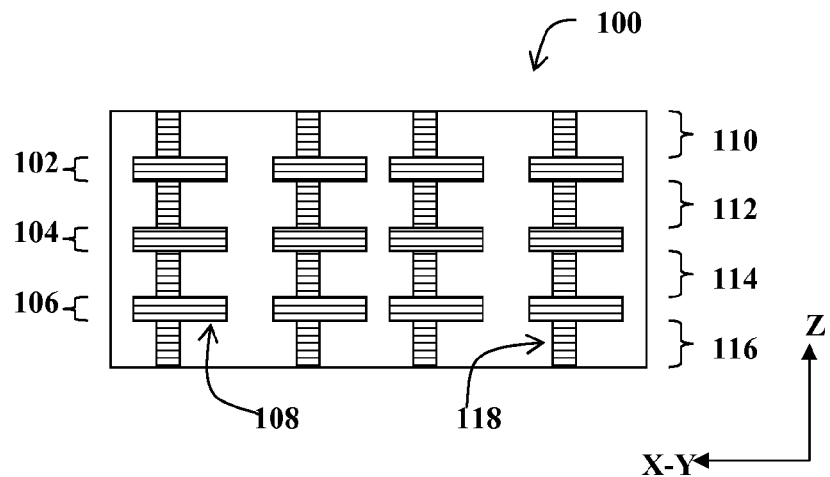
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of encapsulating dielectric 110, 112, 114, 116, which insulate the individual layers. Vias 118 through the encapsulating dielectric layer provide electrical connection between the adjacent functional or feature layers. Thus the feature layers 102, 104, 106 include features 108 generally laid out within the layer, in the X-Y plane, and vias 118 that conduct current across the encapsulating dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the encapsulating dielectric material. Since the encapsulating dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

As described in U.S. Pat. No. 7,682,972, U.S. Pat. No. 7,669,320 and U.S. Pat. No. 7,635,641, for example, the structure of FIG. 1 may alternatively be fabricated by plating within a pattern developed in a photo-resist (pattern plating), or by panel plating and then selectively etching, either way leaving up standing via posts, and then laminating an encapsulating dielectric pre-preg thereover and therearound to embed the via posts and feature layers therein.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when different sized via channels are drilled and then filled with metal to fabricate different sized vias, the via channels fill up at different rates. Consequently, the typical problems of dimpling or overfill (doming) that characterize drill & fill technology are exasperated, since it is impossible to simultaneously optimize deposition techniques for different sized vias. Thus in practical applications, drill & fill vias have substantially circular cross-sections albeit sometimes distorted somewhat due to the heterogeneous nature of the substrate, and all vias have substantially similar cross-sections.

Furthermore, it will be noted that laser drilled vias in composite dielectric encapsulating materials such as polyimide/glass or epoxy/glass or BT (Bismaleimide/Triazine)/glass or their blends with ceramic and/or other filler particles, are practically limited to about $60 \times 10^{-6}$ m diameter, and even so suffer from significant tapering shape as well as rough side walls due to the nature of the composite material drilled, in consequence of the ablation process involved.

It has been surprisingly found that using the flexibility of the plating and photo-resist techniques, a wide range of via shapes and sizes may be cost-effectively fabricated. Furthermore, different via shapes and sizes may be fabricated in the same layer. This is especially facilitated when the copper pattern plating approach is used, by first depositing a metal seed layer and then depositing a photo-resist material and developing smooth, straight, non-tapering trenches therein which may subsequently be filled by depositing copper into these trenches by pattern plating onto the exposed seed layer. In contrast to the drilled & filled via approach, via post technology enables trenches in a photoresist layer to be filled to obtain dimple-less and dome-less copper connectors. After deposition of the copper, the photoresist is subsequent stripped away, the metal seed layer is removed and a permanent, polymer-glass composite encapsulating material is applied thereover and therearound. The 'via conductor' structure thus created may use the process flows as described in U.S. Pat. No. 7,682,972, U.S. Pat. No. 7,669,320 and U.S. Pat. No. 7,635,641 to Hurwitz et al.

In addition to conductive vias and features, it has been found possible to fabricate passive components such as capacitors using electroplating, PVD and encapsulation technologies.

Figure 2:
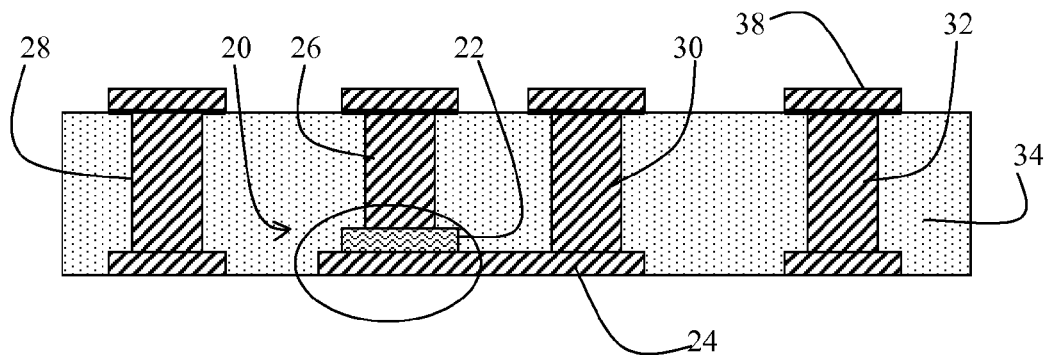
FIG. 2 is a schematic cross-section through a substrate that includes a single layer capacitor and copper vias within a polymer based matrix.

With respect to FIG. 2, a cross section through a one layer capacitor 20 embedded in an encapsulating dielectric 34 is shown. The structure consists of a dielectric material layer 22 deposited over a copper feature layer 24, with a copper pillar 26 grown over the dielectric layer 22. The dielectric material may be $Ta_2O_5$, $BaO_4SrTi$, and $TiO_2$, for example, and may be deposited by a physical deposition process, such as sputtering, for example, of by a chemical deposition process. The copper pillars 26, 28, 30, 32 are encapsulated in an encapsulating dielectric material 34. Where copper pillars 26, 28, 30, 32 are fabricated as via posts using electroplating, the encapsulating dielectric material 34 may be a glass fiber reinforced polymer resin prepreg that is laminated over the copper pillars 26, 28, 30, 32.

In some embodiments, an aluminium layer is laid down adjacent to the $Ta_2O_5$, $BaO_4SrTi$, and $TiO_2$ dielectric, before or after laying down the dielectric. Then, a heat treatment is applied in the presence of oxygen to oxidize the aluminium to form aluminium oxide (alumina—$Al_2O_3$).

The copper feature layer 24 may have a thickness of about 15 microns, with a tolerance of about +−5 microns. Each via post layer is typically about 40 microns but may be anywhere from, say, 20 microns to 80 microns. Outer feature layers 24, 38 which may be termination pads, are again typically about 15 microns but may be anywhere from, say, 10 microns to 25 microns.

Using the simple one layer capacitor of FIG. 2, it is possible to optimize the thickness of the dielectric material 22 and the deposition process thereof. The capacitance is a property of the dielectric constant of the dielectric material 22, and of the area of the metal electrodes, which, in this case, is the cross-sectional area of the copper pillar 26.

Figure 3:
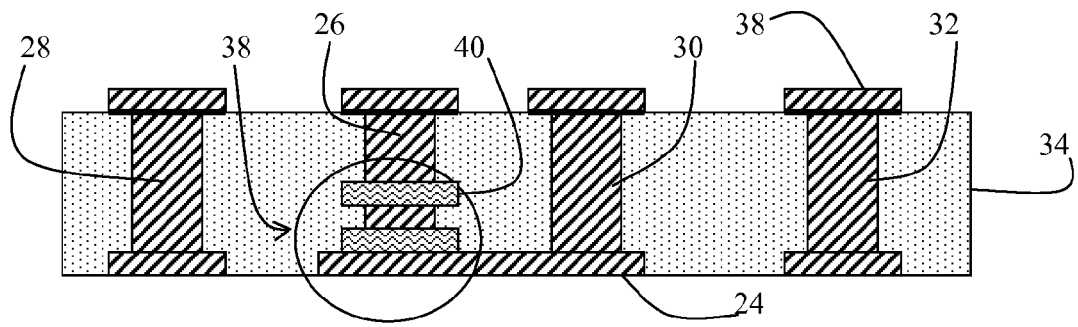
FIG. 3 is a schematic cross-section through a substrate that includes a double layer capacitor and copper vias within a polymer based matrix.

With reference to FIG. 3, a slightly more complicated capacitor 38 is shown. The slightly more complicated capacitor 38 is similar to capacitor 20 mutatis mutandis, but includes a second layer of dielectric 40.

Figure 4:
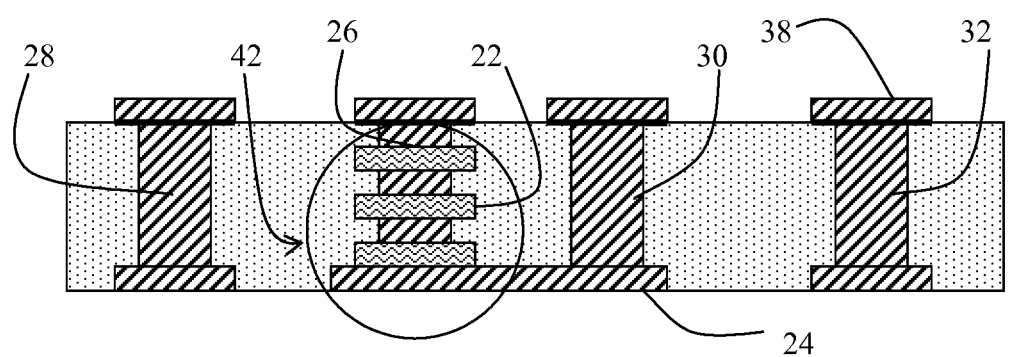
FIG. 4 is a schematic cross-section through a substrate that includes a triple layer capacitor and copper vias within a polymer based matrix.

As shown to FIG. 4, a three layer capacitor 42 is shown. The three layer capacitor 42, consists of dielectric material 22, using copper as the material of the electrodes.

The capacitance of a capacitor is defined by the dielectric constant of the dielectric layer multiplied by the surface area of the capacitor, which is the area of the via pillar 26, divided by the thickness of the dielectric layer 22.

Figure 5:
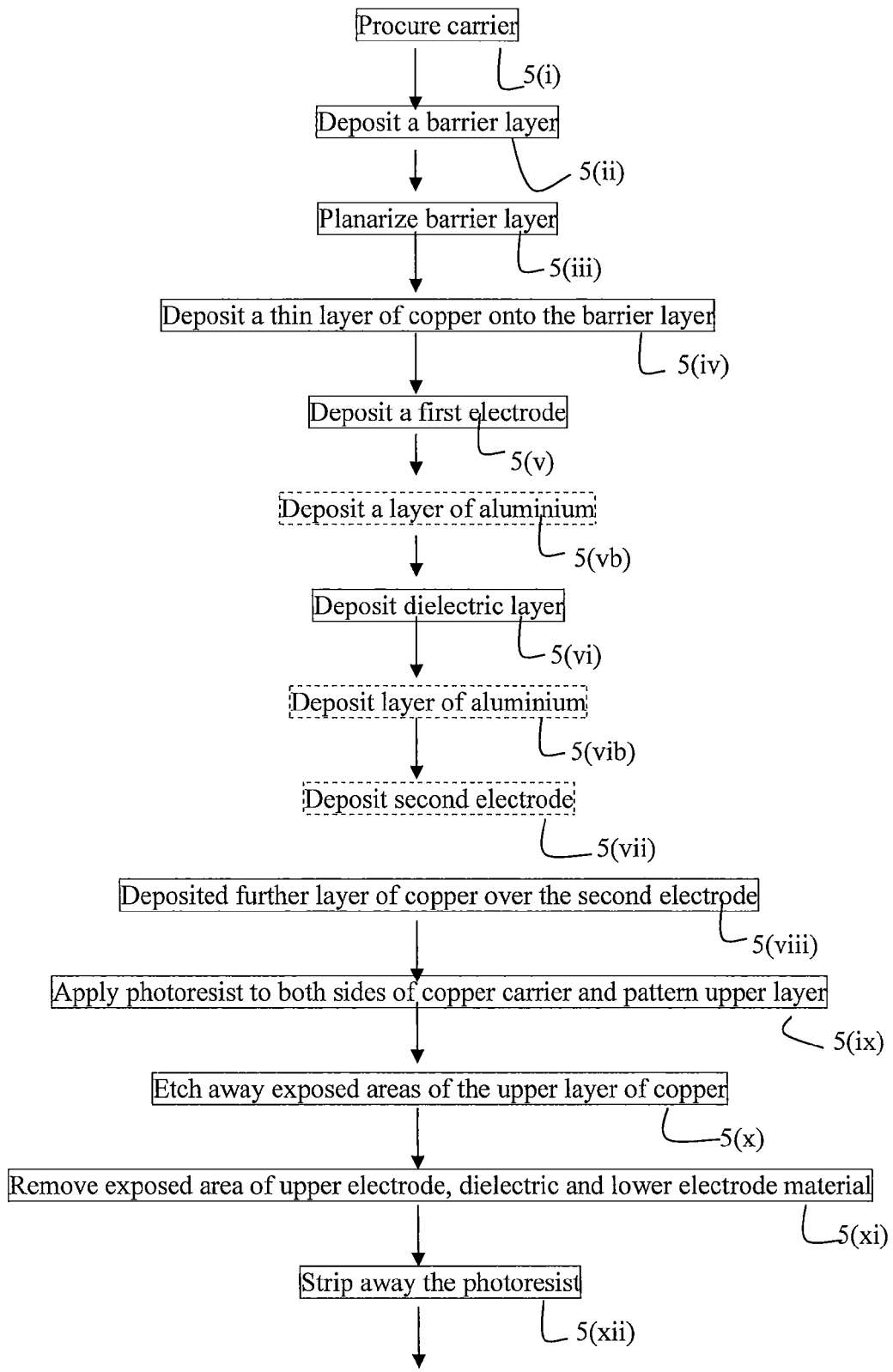
FIG. 5 is a flow chart illustrating a process for fabricating more sophisticated capacitors.
Figure 5:
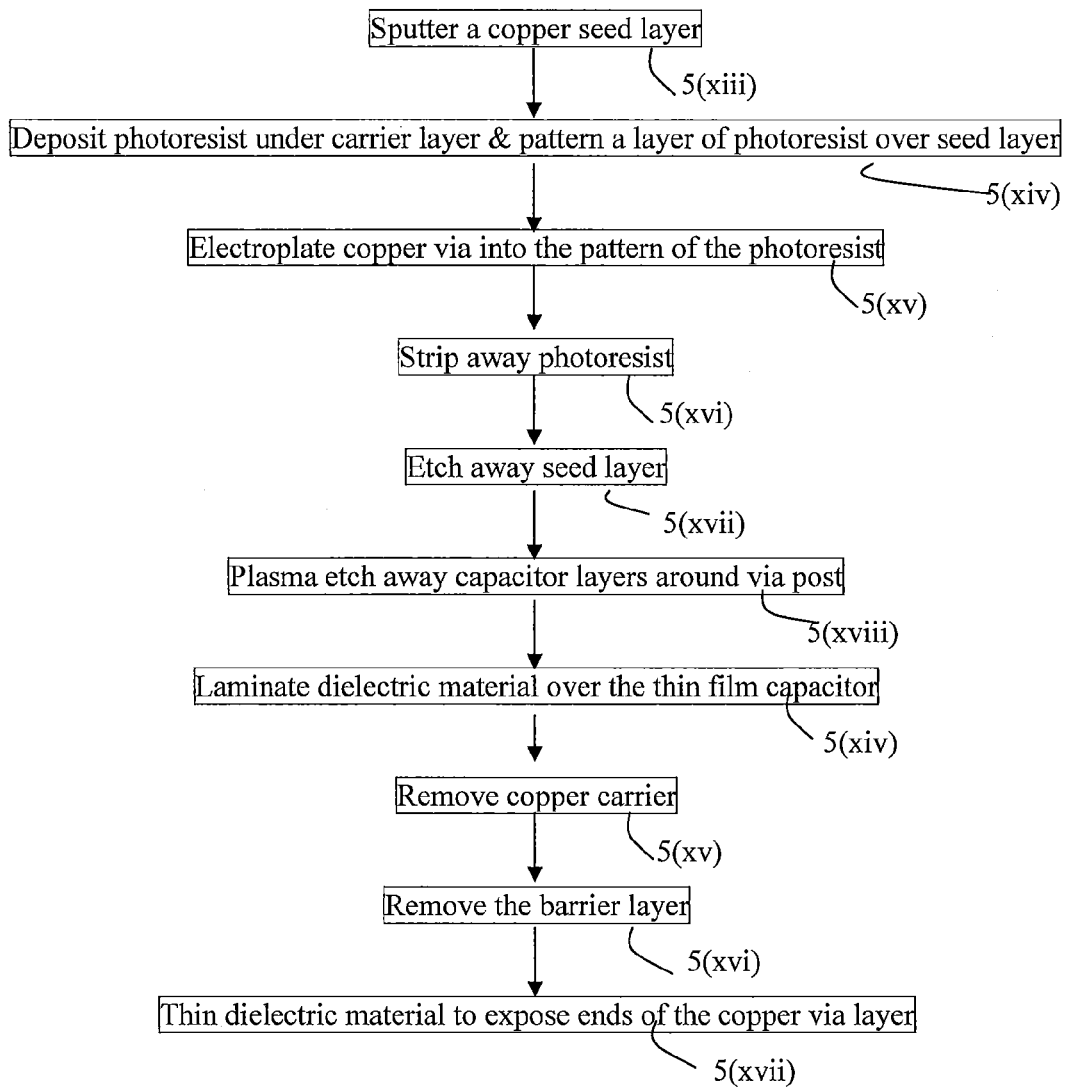
Figure 5I:
Figure 5:
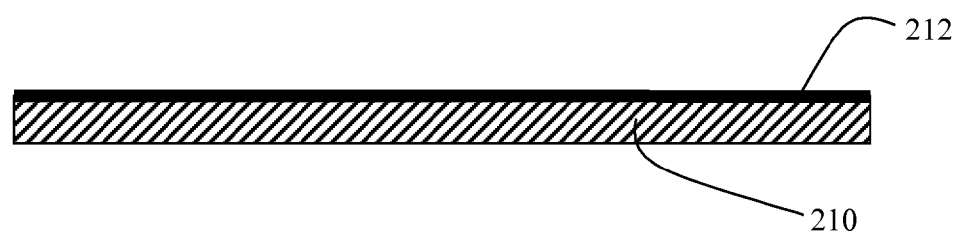
Figure 5:
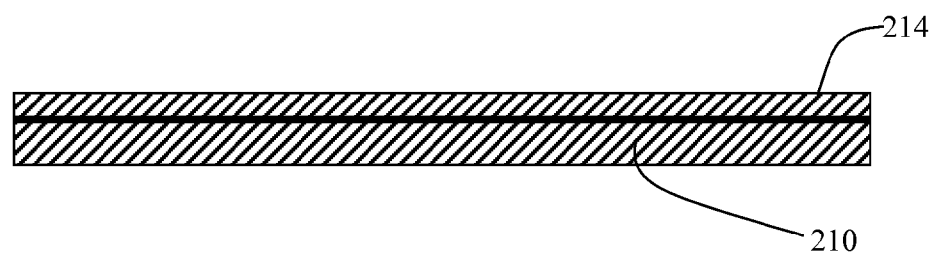
Figure 5V:
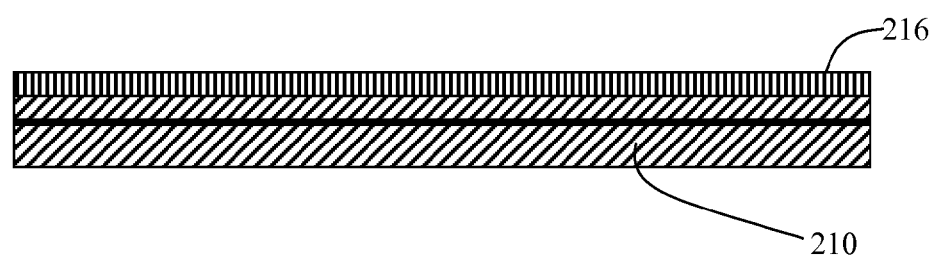
Figure 5:
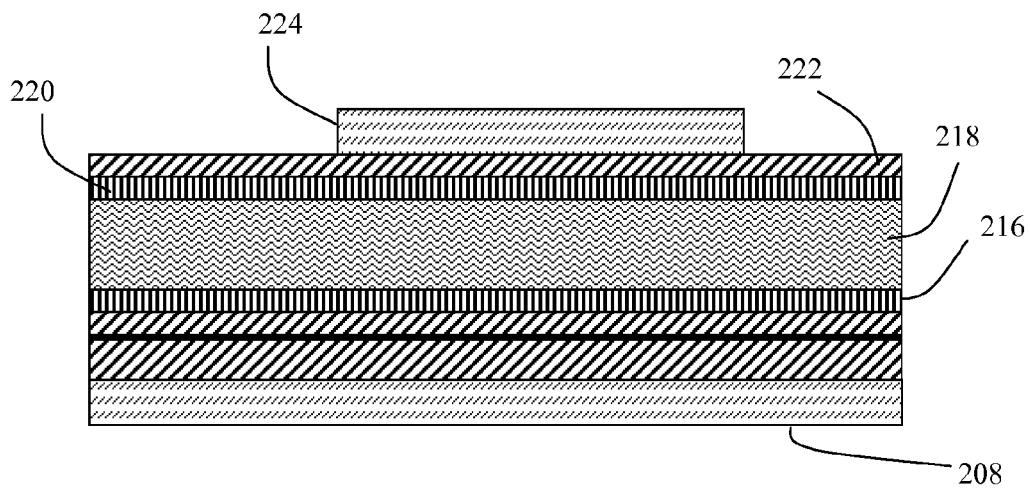
Figure 5X:
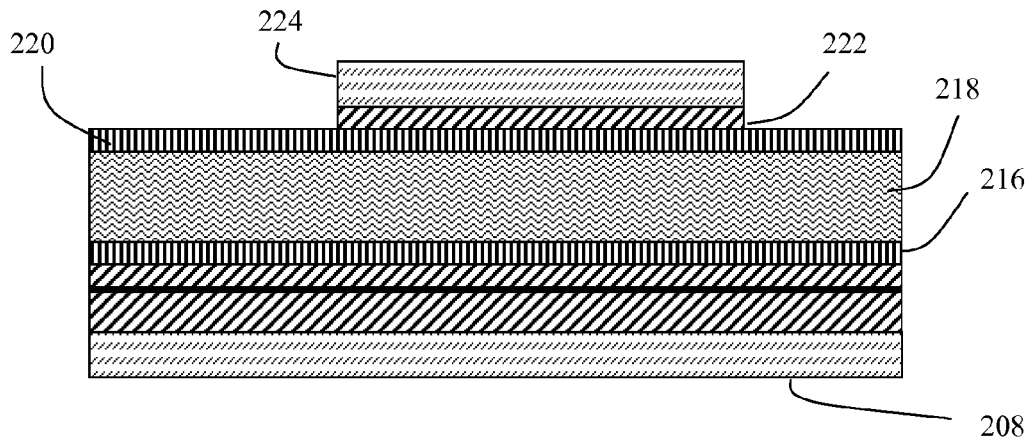
Figure 5:
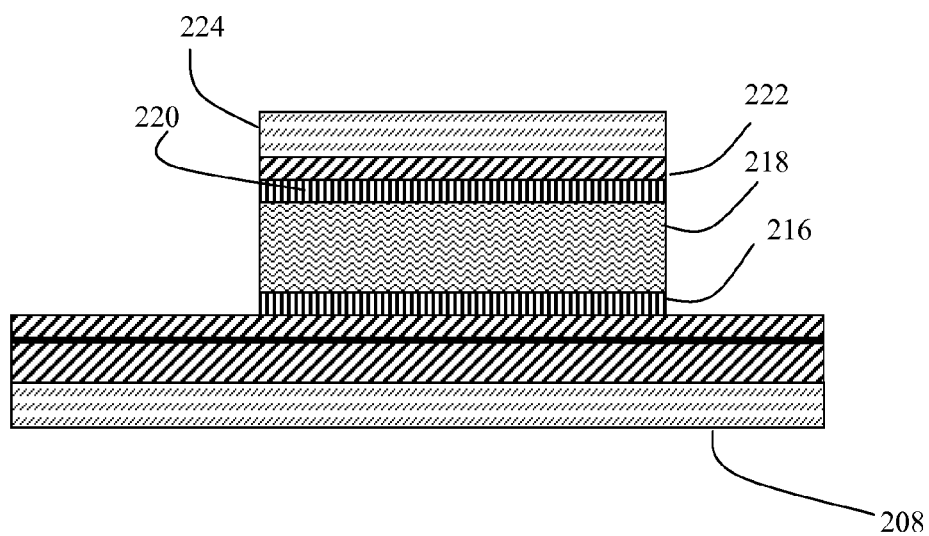
Figure 5:
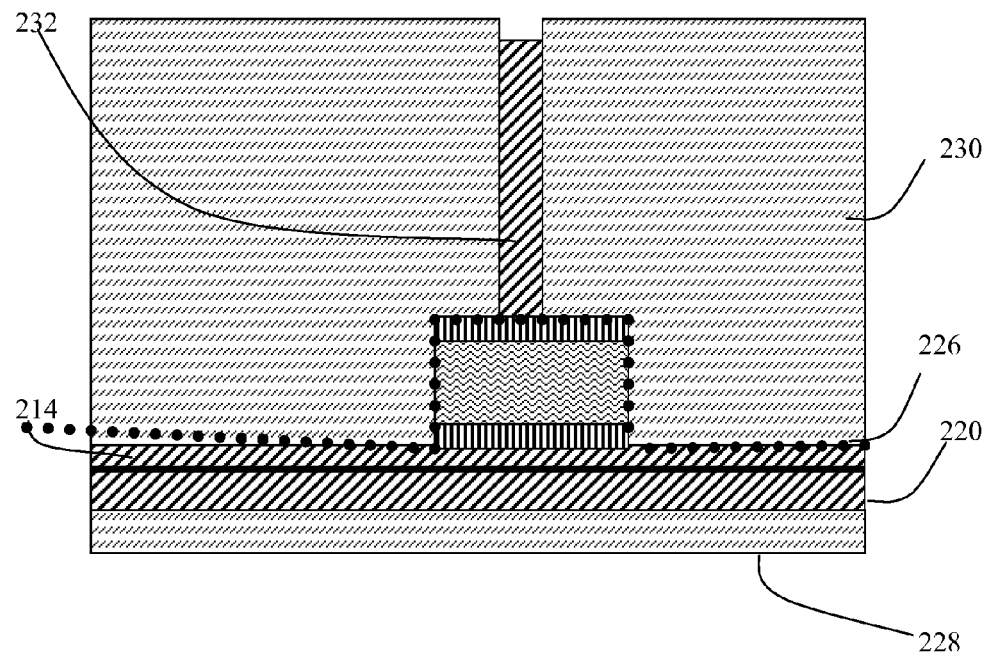
Figure 5:
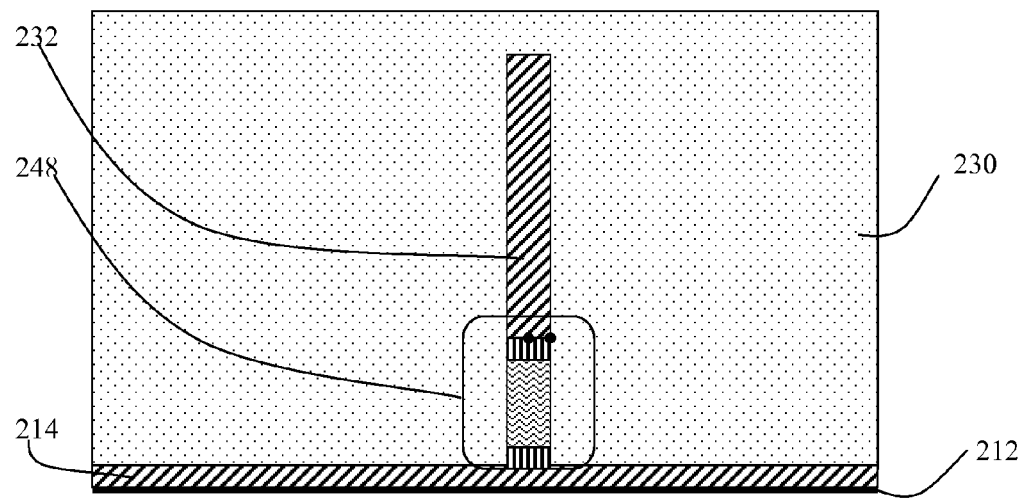

With reference to FIG. 5 steps (i), (ii) and (iv) to (xxii) and to FIGS. 5(*i*) to 5(*xxii*), a method of fabricating a more sophisticated and accurately tunable capacitor embedded in a dielectric is shown. The capacitor 248 shown in FIG. 5(*xxii*) is more complicated than that of FIGS. 2, 3 and 4. Unlike the capacitors of FIGS. 2-4 which have copper electrodes, the capacitors of FIG. 5 have dedicated electrodes of a different material, typically tantalum. Where the dielectric material and its thickness are kept constant, the capacitance of the capacitor 248 is tunable by controlling the exact size of the footprint, i.e. the sectional area of the via 232 deposited thereover. Since the via 232 is fabricated by electroplating into photoresist, it may have substantially any shape or size and need not be substantially circular as drill and filled vias are. It may be rectangular or square, for example.

Firstly, a carrier 210 is procured—step 5(*i*). The carrier 210 is typically a sacrificial copper substrate. In some embodiments, it may be a copper carrier with a quick release thin film of copper appended thereto.

A barrier layer 212 is deposited onto the copper carrier 210—step 5(*ii*). The barrier metal layer 212 may be fabricated from Nickel, Gold, Tin, Lead, Palladium, Silver and combinations thereof. In some embodiments, the barrier metal layer has a thickness in a range of from 1 micron to 10 microns. Typically, the barrier layer 212 comprises nickel. The thin layer of nickel may be deposited by a physical or chemical deposition process, and typically it is sputtered or electroplated onto the copper carrier. For fast processing, the barrier layer 212 may be electroplated. To ensure planarity, it may then be planarized—step 5(*iv*), by chemical mechanical polishing (CMP) for example.

A thin layer of copper 214 is now deposited onto the barrier layer 212—step 5(*iv*). The thickness of the copper layer 214 is typically several microns and may be fabricated by sputtering or by electroplating.

A first electrode material 216 is now deposited—step 5(*v*). By way of example, first electrode material 216 may be tantalum, which may be deposited by sputtering. Other noble materials may be used, such as gold or platinum for example.

A dielectric layer 218 is now deposited—step 5(*vi*). For high performance capacitors, the dielectric layer 218 must be kept as thin as possible, without risking faults that enable charge leakage. There are various candidate materials that may be used. These include $Ta_2O_5$, $BaO_4SrTi$, and $TiO_2$, which may be deposited by sputtering, for example. Typically the thickness of the dielectric layer 218 is in the range of 0.1 to 0.3 microns.

It is difficult to fabricate thin dielectric layers of $Ta_2O_5$, $BaO_4SrTi$, or $TiO_2$ without defects that may result in charge leakage. In some embodiments, an aluminium layer (not shown) is deposited before—Step (vi)b, or after step 5(*vii*)b depositing the $Ta_2O_5$, $BaO_4SrTi$, or $TiO_2$ layer, and by exposure to heat in an oxygen environment. On heating, the aluminium oxidizes to aluminium-oxide (alumina—$Al_2O_3$, which is a dielectric material, and expands in so-doing, filling voids and other defects in the dielectric layer. In this manner, it is possible to cure defects and to ensure that a continuous thin dielectric separates the electrodes.

Figure 7:
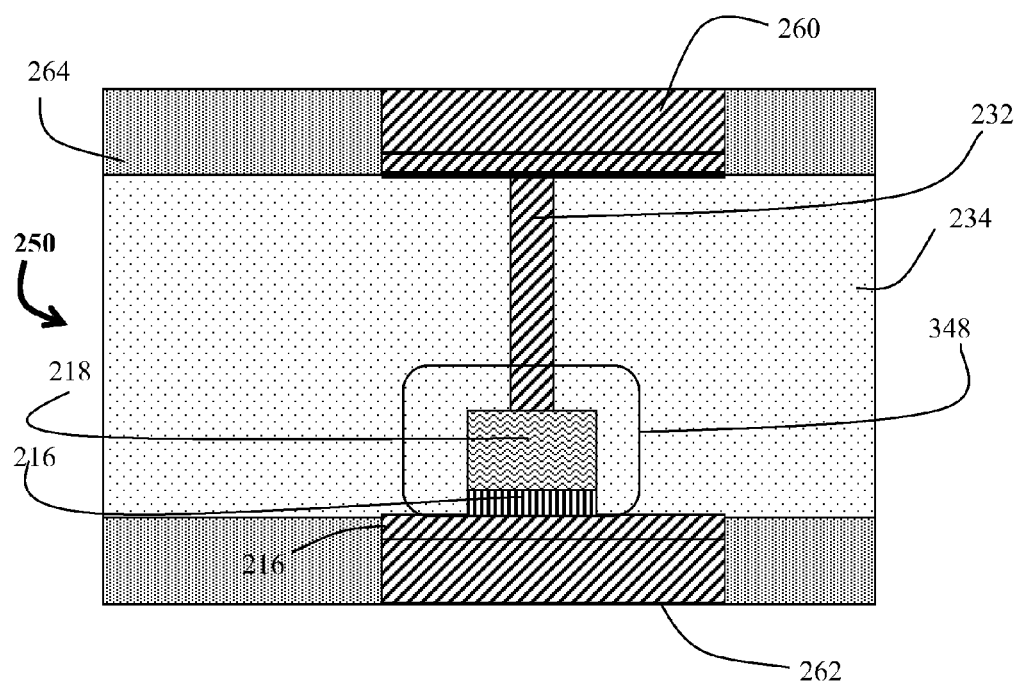
FIG. 7 is a schematic sectional illustration of a variant capacitor, where the copper via serves as the upper plate of the capacitor and defines the capacitance of the capacitor without requiring plasma etching.
Figure 8:
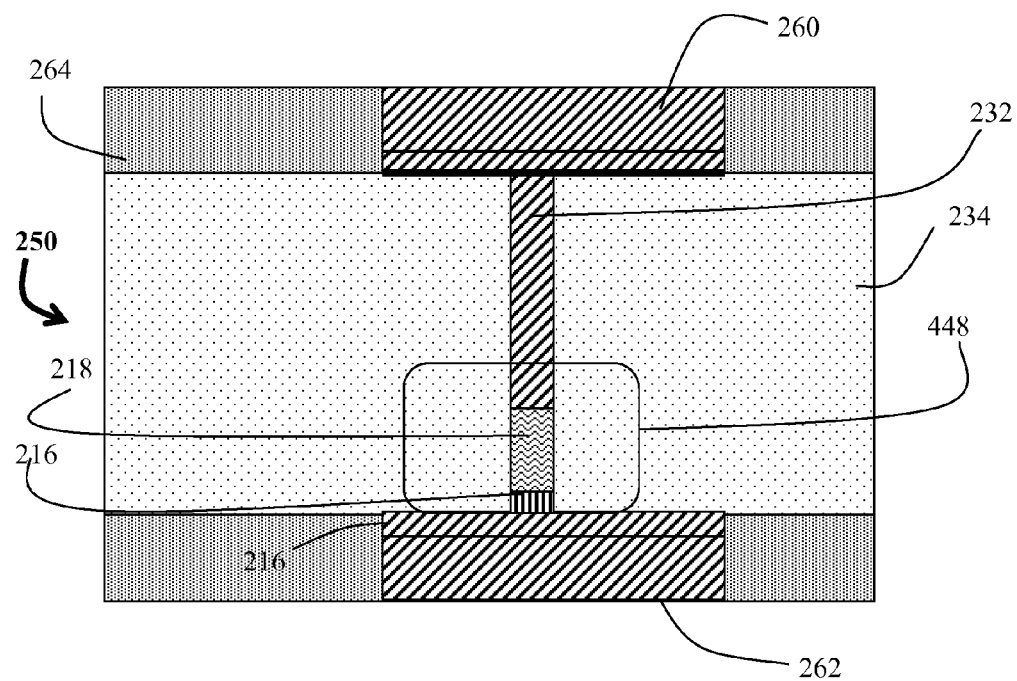
FIG. 8 is a schematic sectional illustration of another variant capacitor, where the copper via serves as the upper plate of the capacitor but where plasma etching is still applied to remove superfluous areas of the dielectric layer and the lower electrode, and to ensure that the copper seed layer is fully removed, thereby preventing shorting and increasing reliability.

A second electrode 220 may now be deposited over the dielectric layer—step 5(*vii*). By way of example, second electrode 220 may be fabricated from tantalum by sputtering. With reference to FIGS. 7 and 8 hereinbelow, it is actually possible to fabricate a variant capacitor by growing a via post directly onto the dielectric layer 218. Nevertheless, for reliability, a second electrode from tantalum or other noble metal is generally sputtered.

A further layer of copper 222 is now deposited over the second electrode 220—step 5(*viii*). Further layer of copper 222 may be deposited by sputtering, for example.

The upper copper layer 222 may be patterned using photoresist to pattern plate or by printing and etching to fabricate pads, conductors and inductors, for example. A layer of photoresist 208 is applied beneath the copper carrier 210, and a second layer of photoresist 224 is applied over the further layer of copper 222 and developed into a pattern—step 5(*ix*).

Areas of the further layer of copper 222 that are not protected by the patterned photoresist 224 are etched away—step 5(*x*). A wet etch may be used. By way of example, one way of etching away the areas of the further layer of copper 222 not protected by the patterned photoresist 224 consists of exposing the sacrificial substrate to a solution of ammonium hydroxide at an elevated temperature. Alternatively copper chloride or a wet Ferric Chloride etch may be used.

The electrode layers 216, 220 and the dielectric layer 218 are dry etched using a plasma etching process—step 5(*xi*). For example, a mixture of $CF_4$ and $O_2$ may be used to plasma etch $TiO_2$ or $Ta_2O_5$ and a mixture of $CF_4$ and Argon may be used to etch $BaO_4SrTi$ (BST). Typically, the concentration ratio for $CF_4:O_2$ may vary between 50:50 to 95:5 (where 95 is for the $CF_4$). Typically, the concentration for $CF_4:Ar$ can be any ratio between 50:50 to 95:5 where 95 is the Argon concentration The patterned photoresist 224 layer is now stripped away—step 5(*xii*) as is generally, the second layer of photoresist 208, which is shortly replaced with a similar layer of photoresist 228—so could be retained.

A seed layer of copper 226 is deposited over the electrode 222—step 5(*xiii*). To help adhesion, a first seed layer of titanium may be first deposited.

Now moving to a different scale for FIG. 5(*xiv*) onwards, a further layer of photoresist 228 is applied to protect the copper substrate (unless photoresist 208 is retained), and a thick layer of photoresist 230 is deposited and patterned over the seed layer 226—step 5(*xiv*). Copper interconnects 232 are now electroplated into the pattern created by the photoresist 230—step 5(*xv*). The photoresist 228 (208), 230 is then stripped away, leaving the capacitor and copper via exposed—step 5(*xvi*).

Alternatively, the upper electrode 220 may be dispensed with, instead, a copper via may be deposited straight onto the ceramic dielectric, the cross-sectional area of the copper via being easily controllable and providing a convenient means of tuning the capacitor. In such cases, there is no need to etch away the dielectric or lower electrode.

The seed layer is then etched away—FIG. 5(*xvii*), and in one variant process, the excess material of the electrodes 216, 220 and dielectric 218 are removed by plasma etching—FIG. 5(*xviii*). The copper via 232 protects the electrodes 216, 220 and dielectric 218 of the capacitor 248 thereunder. The cross-section of the copper via 232, i.e. its footprint on the capacitor 248, defines the area of the capacitor 248, which enables fine tuning Essentially, keeping the thickness and dielectric constant of the dielectric layer constant by constant processing conditions, the cross-sectional area of the via post 232 defines the capacitance. Unlike drill & fill vias, since the via post 232 is fabricated using electroplating into a photoresist 230, it may have substantially any shape and size and may be fabricated to accurate dimensions. Thus a great deal of flexibility in capacitor shape is possible, providing accurately tuned capacitances.

A layer of a polymer based encapsulating dielectric material 234 is laminated over the copper substrate and via—step 5(*xix*). The polymer based encapsulating dielectric material 234 is typically a polyimide, epoxy or BT (Bismaleimide/Triazine) or their blends, and may be reinforced with glass fibers. In some embodiments, a prepreg consisting of woven fiber mats in a polymer resin may be used.

The polymer matrix may include inorganic particulate fillers. These typically have a mean particle size of between 0.5 microns and 30 microns and between 15% and 30% of particulate by weight.

The polymer based encapsulating dielectric material 234 has a lower dielectric constant than that of the dielectric layer 218, which is typically a more exotic material such as $Ta_2O_5$ or $BaO_4SrTi$ or $TiO_2$.

The copper carrier 210 may now be removed—step (xx). Typically it is etched away, using a copper chloride or ammonium chloride solution for so doing, the (typically nickel) barrier layer 212 serving as an etch stop.

The barrier layer 212 may then be removed with an appropriate etching technique, such as plasma etching, or with a specific chemical etchant—step 5(*xxi*). For example, a solution of nitric acid and hydrogen peroxide may be used to dissolve nickel and not copper. Alternative etchants such as hydrochloric acid+hydrogen peroxide, hot concentrated sulfuric acid and iron(III) chloride acidified with hydrochloric acid may be used to dissolve nickel, for example, but do not dissolve copper.

The polymer layer 234 is then thinned and planarized—step 5(*xxii*) to expose the ends of the copper vias 232. Grinding, polishing or a combined chemical mechanical polishing (CMP) may be used.

Thus far, it has been shown how an advanced, high performance capacitor 248 may be embedded into a composite structure 250 that may include surrounding copper vias, underlying and overlying copper feature layers, embedded in a polymer based dielectric matrix 234, 246.

It will be noted that via 232 is not restricted to being a simple cylindrical via post, since it is not fabricated by the drill & fill technology. By fabricating using electroplating into a pattern within a photoresist 242, via 244 may have substantially any shape and size. The capacitor 248 may also be substantially any shape, and will often be square or rectangular, for example.

Figure 6:
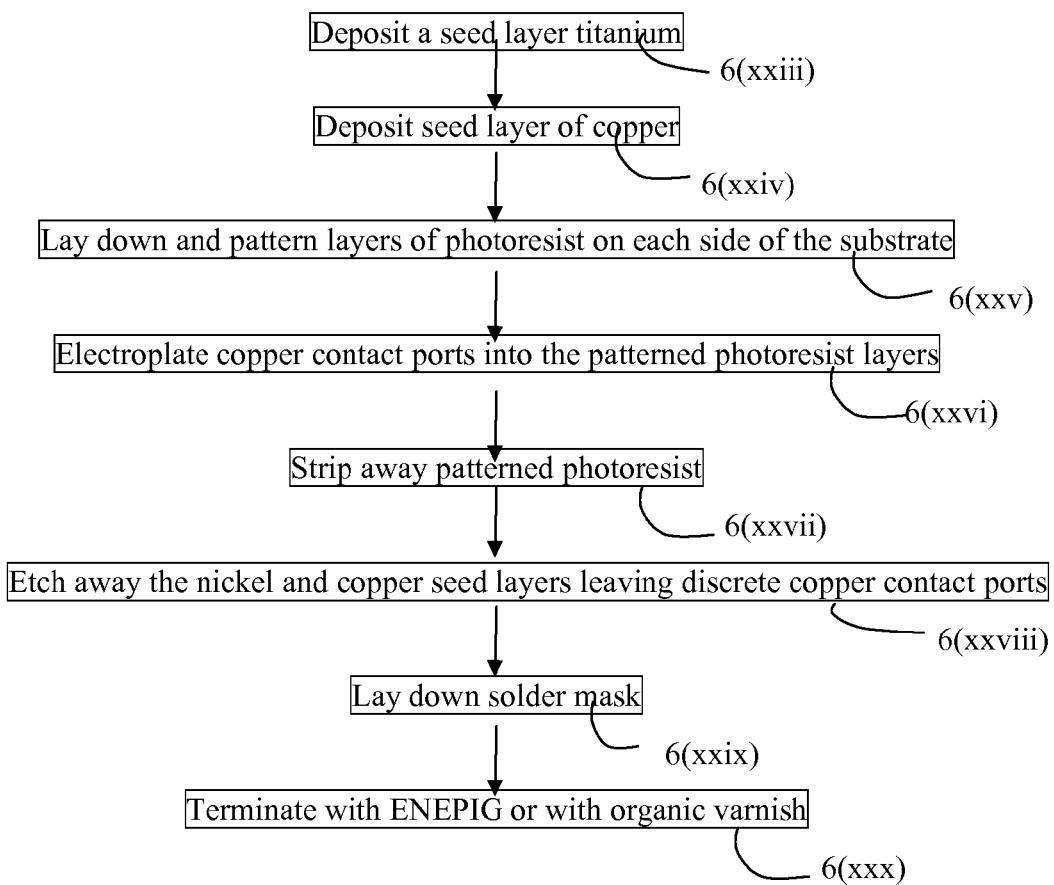
FIG. 6 is a flow chart illustrating a process for terminating the capacitor of FIG. 5.

With reference to FIG. 6 steps 6(*xxiii*) to 6(*xxx*), and to FIGS. 6(*xxiii*) to 6(*xxx*), a technology for applying terminations is described.

With reference to FIG. 6(*xxiii*), a titanium seed layer 252 is sputtered over the matrix 234 and the exposed ends of the copper (inductor) vias 232—step 6(*xxiii*). Referring to FIG. 6(*xxxiv*), a copper layer 254 is now sputtered over the titanium layer 252—step 6(*xxiv*).

With reference to FIG. 6(*xxv*), layers of photoresist 256, 258 are laid down and patterned on each side of the composite structure 250—step 6(*xxv*). Referring to step 6(*xxvi*) copper 260, 262 is electroplated into the patterned photoresist 256, 258—step (xxvi).

With reference to step 6(xxvii), the layers of photoresist 256, 258 are now stripped away leaving the copper upstanding—step 6(xxvii). With reference to FIG. 6(xxviii), the titanium and copper layers are etched away—step 6(xxviii). Copper pads 250, 262 will be slightly damaged in this process. Regions of titanium layer 252 and copper upper layer 254 may be selectively etched away.

Referring to FIG. 6(xxix) The hollows thus formed may be filled with solder mask 264—Step 6(xxix), and the copper protected with Electroless Nickel Electroless Palladium Immersion Gold, commonly known as ENEPIG 266 or with another appropriate termination technology, for example with an organic varnish that prevents oxidation, but which can easily be removed with a gentle organic solvent that does not affect the solder resist or the encapsulating polymer—FIG. 6(xxx)—step 6(xxx).

With reference to FIG. 7, it will be appreciated that the copper via 232 may be deposited directly onto the dielectric layer 218, serving as the upper electrode, and dispensing with the need for a separate upper electrode 222. Thus capacitor 348 consists of lower electrode 216, dielectric layer 218, and via post 232. The lower electrode 216 and dielectric layer 218 may be wider than the copper via 232 which may define the capacitance as being the smaller electrode.

Although this saves fabrication steps since no upper electrode needs to be deposited, and the plasma etching stage is removed, there is a disadvantage in that the copper seed layer 226 is difficult to remove fully without damaging the copper via 232, and shorting is a failure that lowers yields.

Thus with reference to FIG. 8, even where there is no upper electrode (220) distinct from the copper via post 232, or the lower electrode 216 and dielectric layer 218 may be patterned to the size of the copper via 232 by etching away additional material, beyond that covered by the copper via 232, removing all traces of the seed layer 226 and risk of shorting.

Figure 9:
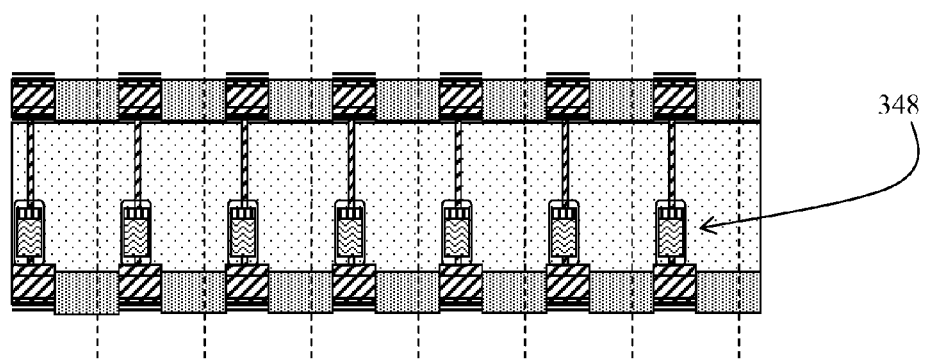
FIG. 9 illustrates how an array of separate capacitors may be singulated for surface mounting.

With reference to FIG. 9, although the manufacture of a single capacitor 248 has been illustrated, it will be appreciated that in practice, vast arrays of capacitors 348 may be cofabricated in large arrays on vast plates, and they may be singulated from each other The capacitors may be surface mounted onto a substrate, as are memory and processing chips, and other components. However, it will also be appreciated that the surface of the substrate, the so-called real-estate, is limited. Capacitors of the invention may be embedded into the substrate during the fabrication thereof, by depositing further feature and via layers there-around.

In general, there is an inherent disadvantage with embedded components in that if something goes wrong, the component and the structure into which it is embedded must be discarded. Sometimes, diagnosing the route cause of a problem may be difficult where a component cannot be isolated and tested individually.

The present technology enables fabrication of capacitors that may be either embedded or surface mounted. Since the processing is very similar, it is possible to surface mount a component during prototyping and development, or small processing runs, and only after being convinced of the general capacity of the reliability It will be appreciated that patterning photo-resists, electro-deposition and sputtering are processes that allow a high degree of control and reproducibility. The electrodes and dielectric layers may be deposited over wide ranges of thicknesses, and may have a wide range of in-layer dimensions. The capacitors may be circular, square or rectangular. They may include 1 or more than one layers.

It is an advantage of the present invention that the same manufacturing steps are used for fabricating both embedded capacitors and surface mounted capacitors. Thus a capacitor may be manufactured to an exact specification and extensively tested and when the manufacturer and customer are totally satisfied with the reproducibility of the component and with its performance, the capacitor may be repositioned within the substrate and cofabricated within the substrate, thereby freeing up expensive 'real estate' on the substrate's surface for chips and other components, and reducing the number of components that need to be subsequently assembled.

Capacitors of the invention may have a wide range of capacitances, depending on their size, their thickness and the dielectric constant of the ceramic. Typically, the capacitance is between 1.5 pF and 300 pF. Most typically, the capacitors have capacitances in the range of between 5 and 15 pF. Such capacitors may be used for various purposes, including, decoupling, impedance circuitry matching and Electro Static Discharge (ESD) protection, for example.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A capacitor comprising metal electrodes and a ceramic or metal oxide dielectric layer, the capacitor being embedded in a polymer based encapsulating material and connectable to a circuit via copper contacts, one of said copper contacts being a via post standing on said capacitor.

2. The capacitor of claim 1, wherein at least one electrode comprises a noble metal.

3. The capacitor of claim 2, wherein at least one electrode comprises a noble metal selected from the group comprising tantalum, gold and platinum.

4. The capacitor of claim 1, wherein the dielectric layer is selected from the group consisting of $Ta_2O_5$, $BaO_4SrTi$, and $TiO_2$.

5. The capacitor of claim 1, wherein the dielectric layer further comprises aluminium oxide, such that flaws in the dielectric layer are sealed with aluminium oxide.

6. The capacitor of claim 1, wherein the polymer based encapsulating material is selected from the group consisting of polyimide, epoxy, BT (Bismaleimide/Triazine) and their blends.

7. The capacitor of claim 6, wherein the polymer based encapsulating material further comprises glass fibers.

8. The capacitor of claim 6, wherein the polymer matrix further comprises inorganic particulate fillers having mean particle size of between 0.5 microns and 30 microns and between 15% and 30% of particulate by weight.

9. The capacitor of claim 1 being embedded in a substrate comprising feature layers coupled by via posts laminated with an encapsulating dielectric material.

10. The capacitor of claim 1, being terminated by copper pads separated by solder mask, the copper pads being protected with ENEPIG to prevent tarnish.

11. The capacitor of claim 1, being terminated by copper pads separated by solder mask, the copper pads being protected with an organic varnish to prevent tarnish.

12. A method of fabricating a capacitor comprising the steps of:
 (i) Procuring a carrier;
 (ii) Depositing a barrier layer;
 (iii) Planarizing the barrier layer;
 (iv) Depositing a thin layer of copper over the barrier layer;
 (v) Depositing a first electrode;
 (vi) Depositing a dielectric layer;
 (viii) Sputtering a copper seed layer
 (ix) Depositing photoresist over the seed layer and patterning the layer of photoresist over the seed layer to create a layer of vias;
 (x) Electroplating copper via into the pattern of the photoresist
 (xi) Stripping away the photoresist;
 (xii) Etching away the seed layer;
 (xiv) Laminating dielectric material over the thin film capacitor;
 (xv) Thinning and planarizing the dielectric material.

13. The method of claim 12 further comprising an additional step selected from the group consisting of (vb) and (vib) of depositing a layer of aluminium adjacent to the layer of dielectric, and oxidizing to aluminium oxide, thereby sealing defects in the layer of dielectric.

14. The method of claim 13 wherein the first electrode is fabricated from a noble metal.

15. The method of claim 14 wherein the noble metal is selected from the group consisting of gold, platinum and tantalum.

16. The method of claim 12 further comprising an additional step (vii) of depositing a second electrode.

17. The method of claim 16 wherein the second electrode is fabricated from a noble metal selected from the group consisting of gold, platinum and tantalum.

18. The method of claim 16 for fabricating surface mountable capacitors further comprising the steps of:
 (xxi) Removing the copper carrier;
 (xxii) Removing the barrier layer;
 (xxxiii) Depositing a seed layer titanium
 (xxiv) Depositing a seed layer of copper
 (xxv) Laying down and patterning layers of photoresist on each side of the substrate with embedded capacitor;
 (xxvi) Electroplating copper contact ports into the patterned photoresist layers;
 (xxvii) Stripping away the patterned photoresist;
 (xxviii) Etching away the nickel and copper seed layers leaving discrete copper contact ports;
 (xxix) Laying down solder mask around the discrete copper contact ports, and
 (xxx) Terminating.

19. The method of claim 18 further comprising the step of singulating.

20. The method of claim 18 wherein said terminating comprises coating the copper contact ports with a tarnish proof conducting layer by ENEPIG.

21. The method of claim 18 wherein said terminating comprises coating the copper contact ports with an organic varnish.

22. The method of claim 12 wherein the dielectric layer is fabricated from a ceramic.

23. The method of claim 22, wherein the ceramic is selected from the group consisting of $Ta_2O_5$, $BaO_4SrTi$, and $TiO_2$.

24. The method of claim 12 further comprising an additional step (xiii) of plasma etching away excess dielectric and electrode material.

25. The method of claim 12 further comprising the steps of:
 (xvi) Depositing a further layer of copper over the planarized material;
 (xvii) Applying photoresist to both sides of the copper carrier and patterning the upper layer to create an array of capacitors;
 (xviii) Etching away exposed areas of the upper layer of copper;
 (xix) Removing exposed area of upper electrode, dielectric and lower electrode material;
 (xx) Stripping away the photoresist.

26. The method of claim 25 for fabricating surface mountable capacitors further comprising the steps of depositing at least one feature or via layer subsequent to step (xvi).

27. The method of claim 12 for fabricating embedded capacitors further comprising the steps of depositing at least one feature or via layer prior to step (iv).

* * * * *